(12) United States Patent
Liu et al.

(10) Patent No.: US 11,333,944 B2
(45) Date of Patent: May 17, 2022

(54) ARRAY SUBSTRATE AND METHOD OF MANUFACTURING THE SAME, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Mingxuan Liu, Beijing (CN); Xiaoxiang Zhang, Beijing (CN); Xiangqian Ding, Beijing (CN); Yongzhi Song, Beijing (CN); Xiangmeng Zhang, Beijing (CN); Xiao Han, Beijing (CN); Honggang Liang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/979,288

(22) PCT Filed: Nov. 28, 2019

(86) PCT No.: PCT/CN2019/121648
§ 371 (c)(1),
(2) Date: Sep. 9, 2020

(87) PCT Pub. No.: WO2021/102811
PCT Pub. Date: Jun. 3, 2021

(65) Prior Publication Data
US 2021/0215984 A1    Jul. 15, 2021

(51) Int. Cl.
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *G02F 1/136209* (2013.01); *H01L 27/124* (2013.01); *H01L 27/127* (2013.01)

(58) Field of Classification Search
CPC ......... G02F 1/136286; G02F 1/136209; G02F 1/1368; G02F 1/136218; H01L 27/124; H01L 27/127
See application file for complete search history.

(56) References Cited

U.S. PATENT DOCUMENTS

2009/0251653 A1    10/2009    Hayashi
2011/0227085 A1*    9/2011    Nakamura ........ G02F 1/133502
257/59

(Continued)

FOREIGN PATENT DOCUMENTS

CN    101373301 A    2/2009
CN    104752489 A    7/2015
(Continued)

*Primary Examiner* — James A Dudek
(74) *Attorney, Agent, or Firm* — McDermott Will & Emery LLP (57) ABSTRACT

An array substrate includes a base, at least one common electrode, at least one signal line and at least one conductive connecting line. The at least one common electrode is formed on the base, and a signal line arranged correspondingly to each of the at least one common electrode is formed on the base. The signal line includes a light absorbing layer and a metal layer that are stacked in a direction away from the base. Conductivity of the light absorbing layer is less than conductivity of molybdenum. Each of the at least one conductive connecting line is electrically connected to both a common electrode and a metal layer in the corresponding signal line.

3 Claims, 4 Drawing Sheets

(56) References Cited

U.S. PATENT DOCUMENTS

| | | | |
|---|---|---|---|
| 2016/0062198 A1* | 3/2016 | Wang | H01L 27/124 257/72 |
| 2017/0148862 A1 | 5/2017 | Xu | |
| 2020/0089064 A1* | 3/2020 | Morinaga | H01L 27/1225 |
| 2021/0141258 A1* | 5/2021 | Maeda | G02F 1/13629 |

FOREIGN PATENT DOCUMENTS

| | | |
|---|---|---|
| CN | 205827025 U | 12/2016 |
| CN | 108089367 A | 5/2018 |

* cited by examiner

ARRAY SUBSTRATE AND METHOD OF MANUFACTURING THE SAME, AND DISPLAY DEVICE

CROSS-REFERENCE TO RELATED APPLICATION

This application is a national phase entry under 35 USC 371 of International Patent Application No. PCT/CN2019/121648 filed on Nov. 28, 2019, which is incorporated herein by reference in its entirety.

TECHNICAL FIELD

The present disclosure relates to the field of display technologies, and in particular to an array substrate and a method of manufacturing the same, and a display device.

BACKGROUND

Liquid crystal display (LCD) devices have characteristics of small size, low power consumption, no radiation, etc., and have rapidly developed in recent years. In the current display field, the LCD device has become one of the mainstream display devices.

SUMMARY

In one aspect, an array substrate is provided. The array substrate includes a base, at least one common electrode formed on the base, a signal line arranged correspondingly to each of the at least one common electrode formed on the base, and at least one conductive connecting line. The signal line includes a light absorbing layer and a metal layer that are stacked in a direction away from the base. Conductivity of the light absorbing layer is less than conductivity of molybdenum. Each of the at least one conductive connecting line is electrically connected to both a common electrode and a metal layer in a corresponding signal line.

In some embodiments, the at least one conductive connecting line is located on a side of the metal layer away from the light absorbing layer. A material of the at least one conductive connecting line is a transparent conductive material.

In some embodiments, a part of the light absorbing layer covers the corresponding common electrode, and a part of each conductive connecting line covers both the corresponding common electrode and the corresponding metal layer.

In some embodiments, the array substrate further includes a pixel electrode located at a side of each common electrode away from the base. The at least one conductive connecting line is insulated from the pixel electrode and arranged in a same layer as the pixel electrode.

In some embodiments, in a same signal line, an orthographic projection of the metal layer on the base is within an orthographic projection of the light absorbing layer on the base.

In some embodiments, the array substrate further includes at least one thin film transistor formed on the base. A gate of the at least one thin film transistor is arranged in a same layer as the signal line.

In some embodiments, a material of the light absorbing layer is molybdenum oxide.

In another aspect, a display device is provided. The display device includes the array substrate described in any of the above embodiments. A surface of the base facing away from the common electrode is a display surface.

In yet another aspect, a method of manufacturing an array substrate is provided. The method includes: providing a base; forming at least one common electrode on the base; forming, on the base, a signal line arranged correspondingly to each of the at least one common electrode; and forming at least one conductive connecting line on a side of the signal line away from the base. The signal line includes a light absorbing layer and a metal layer that are stacked in a direction away from the base. Conductivity of the light absorbing layer is less than conductivity of molybdenum. Each of the at least one conductive connecting line is electrically connected to both a common electrode and a metal layer in a corresponding signal line.

In some embodiments, the method further includes: forming a pixel electrode at a side of each common electrode away from the base. The pixel electrode is insulated from the corresponding conductive connecting line. The at least one conductive connecting line and the pixel electrode are made of a same material through a single patterning process.

BRIEF DESCRIPTION OF THE DRAWINGS

In order to describe technical solutions of embodiments of the present disclosure more clearly, the accompanying drawings to be used in the description of some embodiments will be described briefly below. Obviously, the accompanying drawings to be described below are merely some embodiments of the present disclosure, and a person of ordinary skill in the art can obtain other drawings according to these drawings.

DETAILED DESCRIPTION

Technical solutions in some embodiments of the present disclosure will be described clearly and completely with reference to the accompanying drawings in some embodiments of the present disclosure. Obviously, the embodiments to be described are merely some embodiments of the present disclosure rather than all embodiments of the present disclosure. All other embodiments obtained by a person of ordinary skill in the art based on some embodiments of the present disclosure shall be included in the protection scope of the present disclosure.

A liquid crystal display (LCD) device usually includes an array substrate and a color filter substrate that are paired with each other, and liquid crystal filled between the array substrate and the color filter substrate. A circuit bonding region is disposed on a surface of the array substrate proximate to the color filter substrate. The circuit bonding region is configured to be electrically connected to a flexible circuit board (FPC) or the like.

In some embodiments, a surface of the array substrate facing away from the color filter substrate is a display surface. That is, the surface of the array substrate facing away from the color filter substrate is a surface by which a user views displayed images. In this way, the circuit bonding region of the array substrate is correspondingly located on its non-display surface (i.e., an opposite surface with respect to the display surface). This may avoid an arrangement of a wide bezel on the display surface of the array substrate to encapsulate the circuit bonding region of the array substrate. Thus, a narrow bezel LCD device or even a bezel-free LCD device may be better realized.

However, since a plurality of signal lines and a plurality of pixel driving circuits are usually arranged on a base of the array substrate and the plurality of signal lines and the plurality of pixel driving circuits are usually made of metal, in a case where the surface of the array substrate facing away from the color filter substrate (i.e., a surface of the base facing away from the signal line) is the display surface, the plurality of signal lines and the plurality of pixel driving circuits have high light reflectance, by which external ambient light is reflected easily. Thus, the display effect of the LCD device is reduced.

Figure 1:
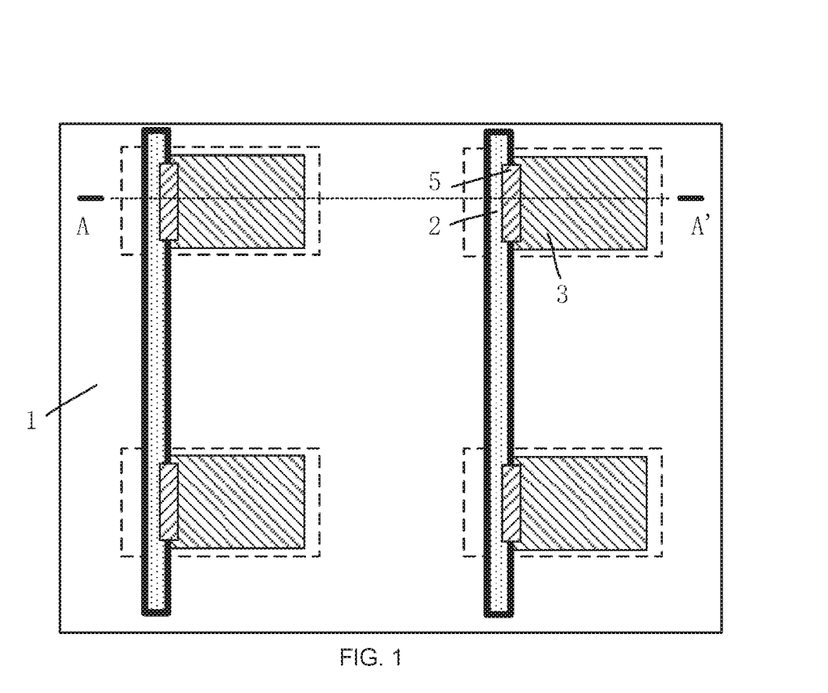
FIG. 1 is a schematic structural diagram of an array substrate, according to some embodiments of the present disclosure.
Figure 2:
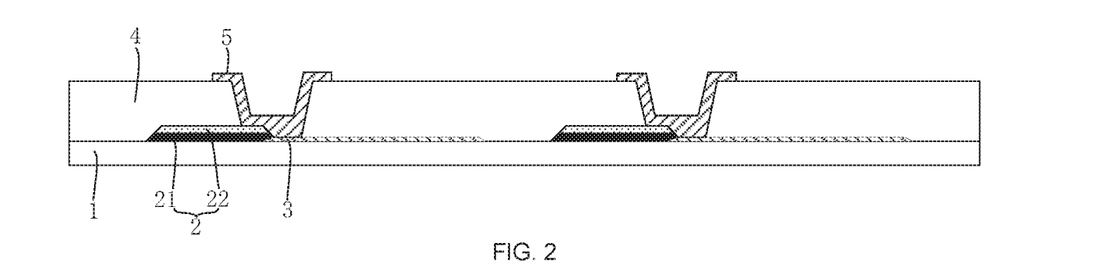
FIG. 2 is a sectional view of an array substrate shown in FIG. 1 along A-A'.

On this basis, some embodiments of the present disclosure provide an array substrate. As shown in FIGS. 1 and 2, the array substrate includes a base 1 and a plurality of signal lines 2 arranged on a side of the base 1. The signal line 2 includes a light absorbing layer 21 and a metal layer 22 that are stacked in a direction away from the base 1. The light absorbing layer 21 in each signal line 2 is located on a side of the metal layer 22 proximate to the base 1. In this way, in a case where the surface of the array substrate facing away from the color filter substrate (i.e., the surface of the base 1 away from the signal lines 2) is the display surface, the light absorbing layer 21 in each signal line 2 may effectively absorb the ambient light to avoid the reflection of the ambient light by the signal line 2.

The plurality of signal lines 2 may be the same or different in type. Optionally, the signal lines 2 are gate lines, data lines or common power lines. The gate lines are configured to provide scanning signals, the data lines are configured to provide data signals, and the common power lines are configured to provide common voltage signals.

In addition, optionally, in a same signal line 2, an orthographic projection of the metal layer 22 on the base 1 is within an orthographic projection of the light absorbing layer 21 on the base 1. In this way, the light absorbing layer 21 in each signal line 2 may effectively shield the metal layer 22 from the external ambient light incident thereon, and thereby the metal layer 22 is prevented from reflecting the external ambient light.

The light absorbing layer 21 in each signal line 2 is made of a material having a light absorbing function, such as metal oxide or metal nitride. Exemplarily, the material of the light absorbing layer 21 is chromium oxide, chromium nitride, tungsten oxide, tungsten nitride, etc. The metal layer 22 in each signal line 2 is made of conductive metal. Exemplarily, the material of the metal layer 22 is aluminum (Al), copper (Cu), molybdenum (Mo), etc.

The signal line 2 is formed by the light absorbing layer 21 and metal layer 22 that are stacked. In this way, the metal layer 22 may effectively transmit signals; meanwhile, the light absorbing layer 21 may absorb the external ambient light. That is, the signal line 2 may ensure good signal transmission quality; meanwhile, the reflection of the external ambient light by the signal line 2 may be reduced or eliminated. Therefore, it is beneficial to improve the display contrast of the LCD device using the array substrate, and it is ensured that the LCD device may clearly display, which has good display effect.

Figure 6:
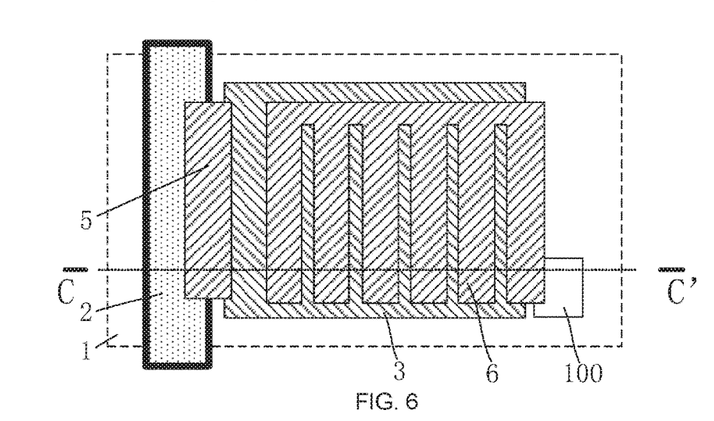
FIG. 6 is a schematic structural diagram of yet another array substrate, according to some embodiments of the present disclosure.
Figure 7:
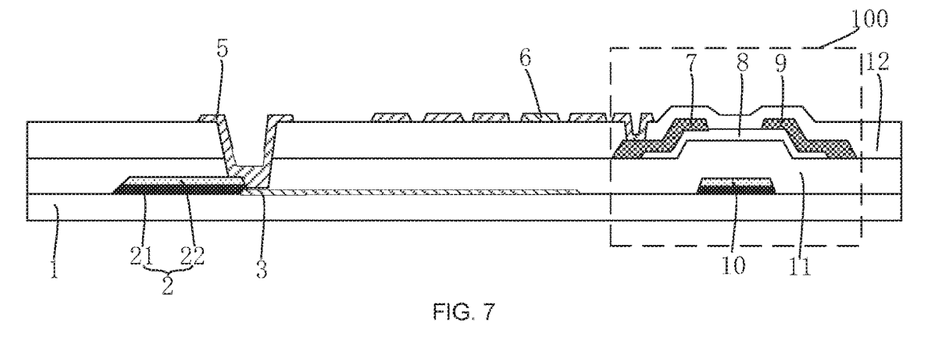
FIG. 7 is a sectional view of an array substrate shown in FIG. 6 along C-C'.

With reference to FIGS. 6 and 7, some embodiments of the present disclosure provide an array substrate, which is to be applied in the LCD device that uses an advanced super dimension switch (ADS) display mode. The array substrate includes: a base 1, at least one common electrode 3 formed on the base 1, and a pixel electrode 6 located at a side of each common electrode 3 away from the base 1. In the array substrate included in the LCD device that uses the ADS display mode, the pixel electrode 6 and the corresponding common electrode 3 are usually located at a same side of liquid crystal, and the common electrode 3 is located at a side of the corresponding pixel electrode 6 proximate to the base 1. The common electrode 3 is insulated from the corresponding pixel electrode 6.

The array substrate further includes a signal line 2 arranged correspondingly to each of the at least one common electrode 3. Herein, the signal line 2 is a common voltage line. The signal line 2 is electrically connected to the corresponding common electrode 3 and configured to provide common voltage signals to the corresponding common electrode 3. With respect to the structure of the signal line 2, please refer to related descriptions in the above embodiments. The array substrate further includes a pixel driving circuit electrically connected to each pixel electrode 6. The pixel driving circuit is configured to provide display driving signals to the corresponding pixel electrode 6. Thus, the display of the LCD device including the array substrate is realized under action of both the pixel electrode 6 and the corresponding common electrode 3.

Figure 3:
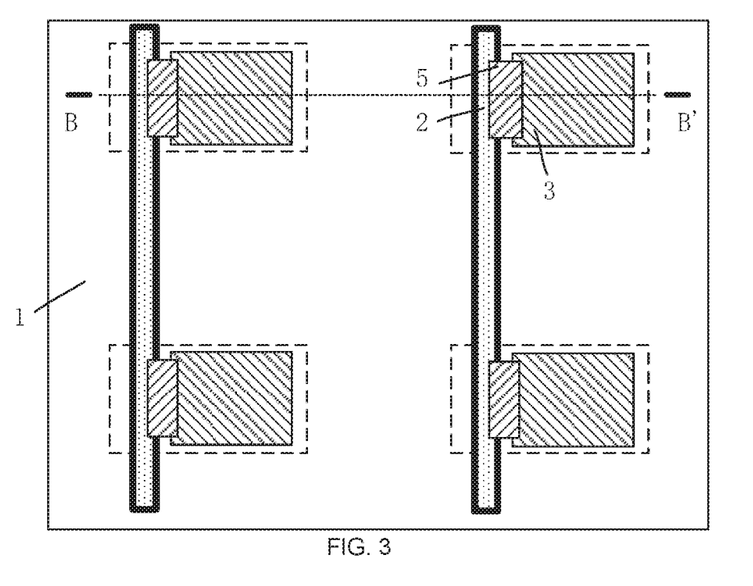
FIG. 3 is a schematic structural diagram of another array substrate, according to some embodiments of the present disclosure.
Figure 4:
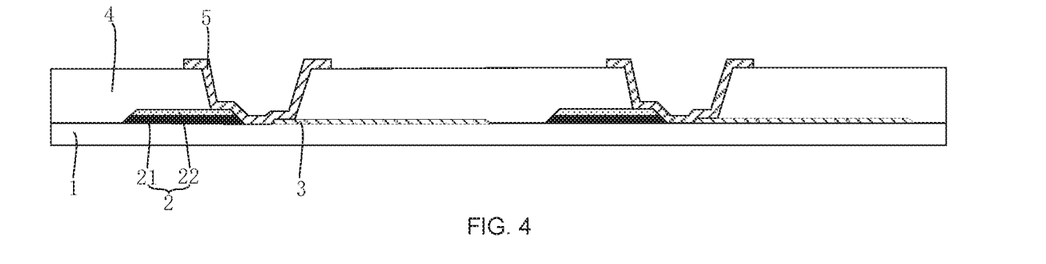
FIG. 4 is a sectional view of an array substrate shown in FIG. 3 along B-B'.
Figure 5:
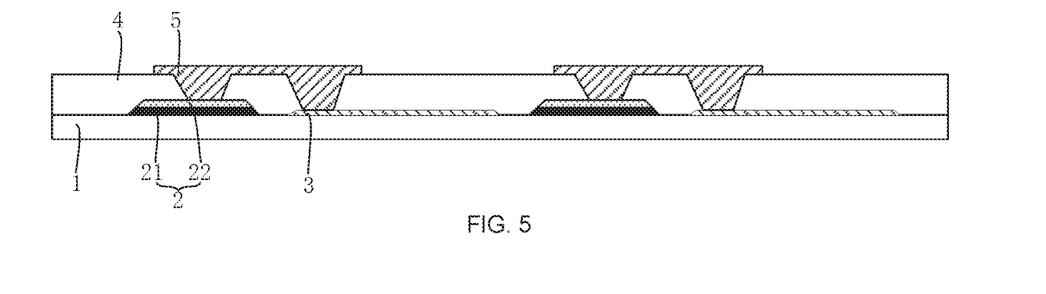
FIG. 5 is a sectional view of another array substrate shown in FIG. 3 along B-B'.

It will be noted that the common electrode 3 and the signal line 2 are usually located on a same side of the base 1. The common electrode 3 is directly formed on the surface of the base 1. The signal line 2 is formed on a side of the common electrode 3 away from the base 1. As shown in FIG. 2, a part of the signal line 2 covers the corresponding common electrode 3. Or, as shown in FIGS. 3-5, there is a gap between the signal line 2 and the corresponding common electrode 3. Both designs are possible.

In some examples, as shown in FIGS. 2 and 7, a part of the signal line 2 covers the corresponding common electrode 3. Since the light absorbing layer 21 in the signal line 2 is located on a side of the metal layer 22 proximate to the base 1, a part of the light absorbing layer 21 in the signal line 2 covers the corresponding common electrode 3. In this way, the process of transmitting signals from the metal layer 22 in the signal line 2 to the corresponding common electrode 3 needs to pass through the light absorbing layer 21.

In this case, conductivity (which is configured as a parameter that describes a difficulty degree of flow of charges in a substance) of the light absorbing layer 21 may influence accuracy of signal transmission between the metal layer 22 and the corresponding common electrode 3. For example, if the conductivity of the light absorbing layer 21 is high, the metal layer 22 can realize good signal transmission with the corresponding common electrode 3 through the light absorbing layer 21. That is, the accuracy of the signal transmission between the metal layer 22 and the corresponding common electrode 3 is high. In contrast, if the conductivity of the light absorbing layer 21 is low, the metal layer 22 is difficult to realize good signal transmission with the corresponding common electrode 3 through the light absorbing layer 21. That is, the accuracy of the signal transmission between the metal layer 22 and the corresponding common electrode 3 is low.

In some examples, the conductivity of the light absorbing layer 21 is low. For example, the conductivity of the light absorbing layer 21 is less than that of Mo. Herein, the conductivity of Mo is usually 34% IACS (International Annealed Copper Standard).

Optionally, the conductivity of molybdenum oxide is less than that of Mo, and the light absorbing layer 21 is made of molybdenum oxide. The light absorptance of molybdenum oxide is high, usually approximately 95%, for example 95.6%. Less than 6% of incident light is reflected by the light absorbing layer 21. Therefore, the light absorbing layer 21 has good light absorbing function, and reflectance of the display surface of the array substrate to the external ambient light may be effectively reduced.

Herein, the molybdenum oxide, which is used for manufacturing the light absorbing layer 21, is obtained by powder sintering and is deposited as a ceramic target material by magnetron sputtering, and there is no post-processing process. The deposited molybdenum oxide is usually in an amorphous state.

On this basis, the conductivity of the light absorbing layer 21 is poor, and thus the accuracy of the signal transmission from the metal layer 22 to the corresponding common electrode 3 through the light absorbing layer 21 is poor. Thus, in some embodiments, with reference to FIGS. 1-7, the array substrate further includes at least one conductive connecting line 5; each conductive connecting line 5 is electrically connected to both a common electrode 3 and a metal layer 22 in a corresponding signal line 2.

In some examples, as shown in FIG. 2, a part of the signal line 2 covers the corresponding common electrode 3. The array substrate further includes an insulating layer 4 formed on a side of the signal line 2 away from the base 1. A via hole corresponding to each common electrode 3 is formed in the insulating layer 4. An orthographic projection of each via hole on the base 1 and an orthographic projection of the corresponding signal line 2 on the base 1 have an overlapping region therebetween, and the orthographic projection of each via hole on the base 1 and an orthographic projection of the corresponding common electrode 3 on the base 1 have an overlapping region therebetween. Each conductive connecting line 5 is formed in a corresponding via hole, and is in contact with the metal layer 22 in the corresponding signal line 2 and the corresponding common electrode 3. In this way, signals transmitted by the metal layer 22 in the signal line 2 may be well transmitted to the corresponding common electrode 3 by the conductive connecting line 5, so as to effectively ensure the accuracy of the signal transmission between the signal line 2 and the corresponding common electrode 3.

In addition, in some other embodiments, as shown in FIGS. 3-5, there is a gap between the signal line 2 and the corresponding common electrode 3. The array substrate further includes at least one conductive connecting line 5; each conductive connecting line 5 is electrically connected to both a common electrode 3 and a metal layer 22 in a corresponding signal line 2.

In some examples, as shown in FIG. 4, the array substrate further includes an insulating layer 4 formed on a side of the signal line 2 away from the base 1. A via hole corresponding to each common electrode 3 is formed in the insulating layer 4. An orthographic projection of each via hole on the base 1 and an orthographic projection of the corresponding signal line 2 on the base 1 have an overlapping region therebetween, and the orthographic projection of each via hole on the base 1 and an orthographic projection of the corresponding common electrode 3 on the base 1 have an overlapping region therebetween. Each conductive connecting line 5 is formed in a corresponding via hole, and is in contact with the metal layer 22 in the corresponding signal line 2 and the corresponding common electrode 3. In this way, signals transmitted by the metal layer 22 in the signal line 2 may be well transmitted to the corresponding common electrode 3 by the conductive connecting line 5, so as to effectively ensure the accuracy of the signal transmission between the signal line 2 and the corresponding common electrode 3.

In some other examples, as shown in FIG. 5, there is a gap between the signal line 2 and the corresponding common electrode 3. The array substrate further includes an insulating layer 4 formed on a side of the signal line 2 away from the base 1. A first via hole corresponding to each common electrode 3 and a second via hole corresponding to each signal line 2 are formed in the insulating layer 4. An orthographic projection of each first via on the base 1 and an orthographic projection of the corresponding common electrode 3 on the base 1 have an overlapping region therebetween, and an orthographic projection of each second via on the base 1 and an orthographic projection of the corresponding signal line 2 on the base 1 have an overlapping region therebetween. Each conductive connecting line 5 is formed in a corresponding first via hole and a corresponding second via hole, and is in contact with the corresponding common electrode 3 through its part located in the first via hole and in contact with the metal layer 22 in the corresponding signal line 2 through its part located in the second via hole. In this way, signals transmitted by the metal layer 22 in the signal line 2 may be well transmitted to the corresponding common electrode 3 by the conductive connecting line 5, so as to effectively ensure the accuracy of the signal transmission between the signal line 2 and the corresponding common electrode 3.

In conclusion, in the array substrate provided in some embodiments of the present disclosure, each conductive connecting line 5 is electrically connected to both a common electrode 3 and a metal layer 22 in a corresponding signal line 2. In this way, it may be ensured that the accuracy of the signal transmission between the signal line 2 and the corresponding common electrode 3 is high, meanwhile, the reflectance of the display surface of the array substrate is low.

In addition, in some above embodiments, the increase of the contact area of each conductive connecting line 5 with the corresponding common electrode 3 and the increase of the contact area of each conductive connecting line 5 with the corresponding metal layer 22 may effectively improve the efficiency of the metal layer 22 in transmitting signals to the common electrode 3.

It will be noted that each conductive connecting line 5 is located on a side of the metal layer 22 away from the light absorbing layer 21, and is electrically connected to the corresponding common electrode 3. In a case where the array substrate is applied in the LCD device that uses the ADS display mode, each common electrode 3 is located in a light exit region of the array substrate. Each conductive connecting line 5 is made of a transparent conductive material, which may prevent each conductive connecting line 5 from affecting the normal exit of light from the array substrate. That is, the aperture rate of the array substrate will not be reduced. Optionally, the material of each conductive connecting line 5 is, but not limited to, Indium Tin Oxide (ITO).

In some embodiments, each conductive connecting line 5 and the corresponding pixel electrode 6 are arranged in a same layer. That is, each conductive connecting line 5 and the pixel electrode 6 are made of a same material through a single patterning process. This is beneficial to simplify the manufacturing process of the array substrate and reduce its production cost.

The patterning process includes a photolithography process, or a process including a photolithography process and an etching step. The photolithography process is a process that includes film formation (for example, Chemical Vapor Deposition (CVD) film formation), exposure, developing and other processes, and is used to form patterns by using photoresists, masks, exposure machines, etc.

Herein, each conductive connecting line 5 is insulated from the corresponding pixel electrode 6. Signals that can be transmitted by them are different.

In some embodiments of the present disclosure, the pixel driving circuit correspondingly in electrical connection to each pixel electrode 6 includes at least one thin film transistor, and one thin film transistor 100 of the at least one thin film transistor is electrically connected to the corresponding pixel electrode 6 directly.

The structure and type of the thin film transistors may be determined according to actual requirements.

Exemplarily, with reference to FIGS. 6 and 7, the thin film transistor 100 is a bottom-gate thin film transistor. That is, the thin film transistor 100 includes a gate 10, a gate insulating layer 11 and an active layer 8 that are sequentially stacked in a direction away from the base 1, as well as a drain 7 and a source 9 electrically connected to the active layer 8. The array substrate further includes a passivation layer 12 located on a side of the thin film transistor 100 away from the base 1. A via hole corresponding to each pixel electrode 6 is disposed in the passivation layer 12. Each pixel electrode 6 is electrically connected to the drain 7 of a corresponding thin film transistor 100 by passing through a corresponding via hole.

In addition, in some above embodiments, each signal line 2 and the gate 10 of each thin film transistor 100 are arranged in a same layer. That is, they may be made of a same material by a single patterning process. That is, the gate 10 of each thin film transistor 100 correspondingly consists of a light absorbing layer and a metal layer. In this way, it is beneficial to simplify the manufacturing process of the array substrate and reduce its production cost, and it may also avoid the reflection of the external ambient light by the gate 10 of each thin film transistor 100, thereby further decreasing the reflectance of the display surface of the array substrate. It is beneficial to increase the display contrast of the LCD device including the array substrate, and it is ensured that the LCD device may achieve more clear display.

Figure 8:
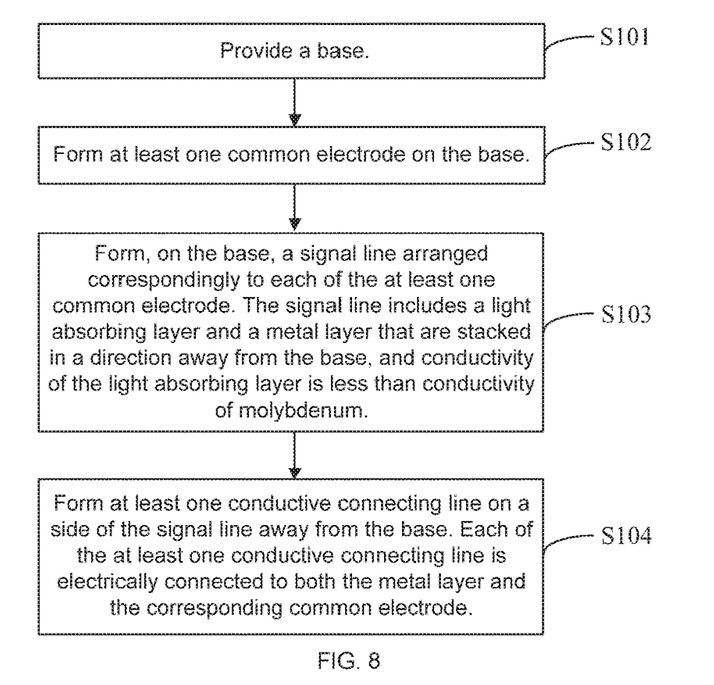
FIG. 8 is a flowchart of a method of manufacturing an array substrate, according to some embodiments of the present disclosure.
Figure 9:
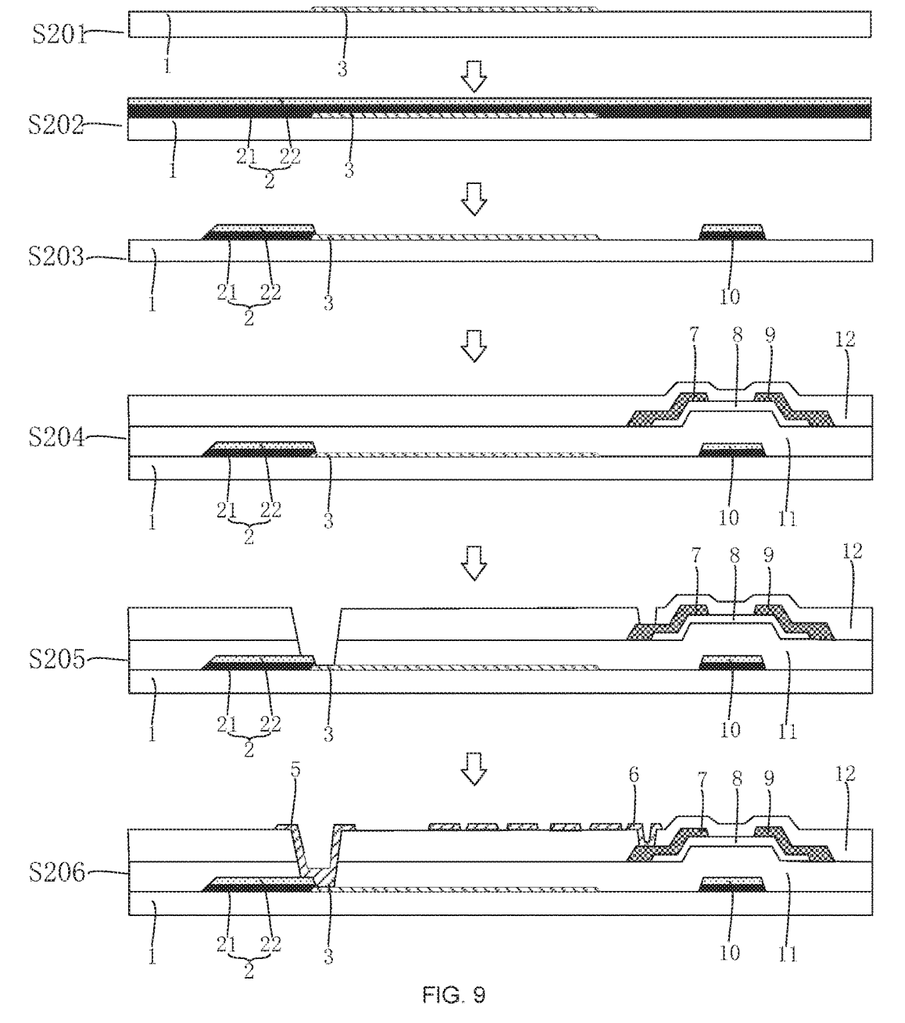
FIG. 9 is a schematic diagram of processing steps of a method of manufacturing an array substrate, according to some embodiments of the present disclosure.

Some embodiments of the present disclosure provide a method of manufacturing an array substrate. This method is used for manufacturing the array substrate described in some above embodiments. With reference to FIGS. 8 and 9, the method of manufacturing the array substrate includes S101 to S104.

In S101, a base 1 is provided.

Optionally, the base 1 is a blank substrate, for example, a glass substrate, on which no any electronic device or circuit structure is manufactured.

In S102, at least one common electrode 3 is formed on the base 1.

Optionally, the at least one common electrode 3 is made of a transparent conductive material.

In S103, a signal line 2 arranged correspondingly to each of the at least one common electrode 3 is formed on the base 1. The signal line 2 includes a light absorbing layer 21 and a metal layer 22 that are stacked in a direction away from the base 1, and conductivity of the light absorbing layer 21 is less than that of Mo.

Herein, the signal line 2 is a common power line configured to provide common voltage signals to the corresponding common electrode 3. With respect to the structure of the metal layer 22 and the light absorbing layer 21 in the signal line 2, please refer to the related descriptions in some above embodiments, which is not described herein again.

In S104, at least one conductive connecting line 5 is formed on aside of the signal line 2 away from the base 1. Each of the at least one conductive connecting line 5 is electrically connected to both a common electrode 3 and a metal layer 22 in a corresponding signal line 2.

Herein, with respect to the material and structure of each conductive connecting line 5 as well as the way for the electrical connection of each conductive connecting line 5 to the corresponding common electrode 3 and the metal layer 22 in the corresponding signal line 2, please refer to the related descriptions in some above embodiments, which is not described herein again.

The method of manufacturing the array substrate has the same beneficial effects as the array substrate provided in some above embodiments, which is not described herein again.

In some embodiments, the method of manufacturing the array substrate further includes: forming a pixel electrode 6 at a side of each common electrode 3 away from the base 1. In the array substrate in the LCD device that uses the ADS display mode, the pixel electrode 6 and the corresponding common electrode 3 are usually located at a same side of liquid crystal, and the common electrode 3 is located at a side of the corresponding pixel electrode 6 proximate to the base 1. The common electrode 3 is insulated from the corresponding pixel electrode 6.

Herein, each pixel electrode 6 and the corresponding conductive connecting line 5 may be made of a same material through a single patterning process. This is beneficial to simplify the manufacturing process of the array substrate and reduce its production cost. In addition, each pixel electrode 6 is insulated from the corresponding conductive connecting line 5.

In order to describe the method of manufacturing the array substrate in some embodiments of the present disclosure more clearly, the method is described in detail below by taking the array substrate shown in FIG. 7 as an example.

With reference to FIG. 9, the method of manufacturing the array substrate includes S201 to S206.

In S201, a first electrode film is formed on a base 1 by using the transparent conductive material, and the first electrode film is patterned to form at least one common electrode 3.

In S202, a light absorbing film and a metal film are formed and stacked on top of one another on the base 1 on which at least one common electrode 3 has been formed.

In S203, the light absorbing film and the metal film are patterned through a single patterning process to form a signal line 2 corresponding to each common electrode 3 and a gate 10 of each thin film transistor 100.

Herein, a part of the signal line 2 covers the corresponding common electrode 3; or, there is a gap between the signal line 2 and the corresponding common electrode 3. Both designs are possible.

Optionally, a part of the light absorbing layer 21 in the signal line 2 covers the corresponding common electrode 3.

In S204, a gate insulating layer 11, an active layer 8 obtained by pattering, a drain 7 and a source 9 that are obtained by patterning, and a passivation layer 12 are sequentially formed on the base 1 on which the above steps have been completed.

Herein, the materials and manufacturing methods of the gate insulating layer 11, the patterned active layer 8, the patterned drain 7 and source 9 and the passivation layer 12 may be conventional materials and manufacturing methods in the art, and may be flexibly selected according to actual requirements, which is not limited in some embodiments of the present disclosure.

In S205, via hole(s) are formed in a part of the passivation layer 12 corresponding to each common electrode 3 and a via hole is formed in a part of the passivation layer 12 corresponding to each pixel electrode 6 to be formed.

Herein, the position and size of each via hole may be determined according to actual requirements, as long as they can meet the use requirements.

In S206, a second electrode film is formed on a surface of the passivation layer 12 facing away from the base 1 by using the transparent conductive material, and the second electrode film is patterned to form conductive connecting line(s) 5 and pixel electrode(s) 6.

Herein, the conductive connecting line(s) 5 are insulated from the pixel electrode(s) 6. Signals that can be transmitted by them are different. Each pixel electrode 6 is electrically connected to a drain 7 of a corresponding thin film transistor 100 by passing through a corresponding via hole. Each conductive connecting line 5 is electrically connected to a corresponding common electrode 3 by passing through a corresponding via hole and to a metal layer 22 in a corresponding signal line 2 by passing through a corresponding via hole.

Some embodiments of the present disclosure provide a display device. With reference to FIG. 9, the display device 1000 includes the array substrate 1001 provided by some above embodiments. A surface of the base 1 in the array substrate 1001 away from the common electrode 3 is a display surface. In this way, the circuit bonding region of the array substrate is correspondingly located on its non-display surface (i.e., the opposite surface with respect to the display surface). This may avoid the arrangement of a wide bezel on the display surface of the array substrate to encapsulate the circuit bonding region of the array substrate. Thus, a narrow bezel LCD device or even a bezel-free LCD device may be realized.

In addition, the display device has the same beneficial effects as the array substrate provided in some above embodiments, which is not described herein again.

Figure 10:
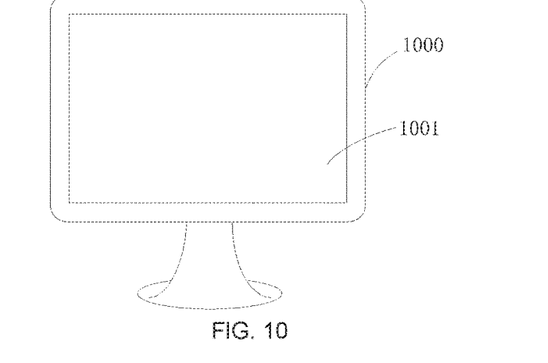
FIG. 10 is a schematic structural diagram of a display device, according to some embodiments of the present disclosure.

In some examples, the display device 1000 is a LCD device. Optionally, the display device 1000 is a product or component that has a display function, for example, a mobile phone, a notebook computer or a television.

In addition, the terms "first" and "second" are for illustration purposes only and are not to be construed as indicating or implying relative importance or implied reference to the quantity of indicated technical features. Therefore, features defined as "first" and "second" may explicitly or implicitly include one or more of the features. In the description of the present disclosure, unless otherwise stated, "a/the plurality of" means two or more.

In the description of the above implementations, the specific features, structures, materials, or characteristics may be combined in a proper manner in any one or more embodiments or examples.

The forgoing descriptions are merely specific implementations of the present disclosure, and the protection scope of the present disclosure is not limited thereto. A person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate, comprising:
   a base;
   at least one common electrode formed on the base and a common power line arranged correspondingly to each of the at least one common electrode formed on the base, wherein the common power line includes a light absorbing layer and a metal layer that are sequentially stacked in a direction away from the base, the common power line is configured to provide a common voltage signal to a corresponding common electrode, and conductivity of the light absorbing layer is less than conductivity of molybdenum;
   at least one conductive connecting line, each of the at least one conductive connecting line being electrically connected to both a common electrode and a metal layer in a corresponding common power line;
   a pixel electrode located at a side of each common electrode away from the base; the at least one conductive connecting line being insulated from the pixel electrode and arranged in a same layer as the pixel electrode;
   at least one thin film transistor formed on the base; a gate of the at least one thin film transistor being arranged in a same layer as the common power line;
   wherein a surface of the base facing away from the common electrode is a display surface;
   the at least one conductive connecting line is located on a side of the metal layer away from the light absorbing layer;
   a material of the at least one conductive connecting line is a transparent conductive material;
   a part of the light absorbing layer covers the corresponding common electrode so as to no space exists between the common power line and the common electrode, and a part of each conductive connecting line covers both the corresponding common electrode and the corresponding metal layer;
   in a same common power line, an orthographic projection of the metal layer on the base is within an orthographic projection of the light absorbing layer on the base; and
   a material of the light absorbing layer is molybdenum oxide.

2. A display device, comprising the array substrate according to claim 1.

3. A method of manufacturing an array substrate, comprising:
provide a base;
forming at least one common electrode on the base;
forming, on the base, a common power line arranged correspondingly to each of the at least one common electrode, wherein
the common power line includes a light absorbing layer and a metal layer that are sequentially stacked in a direction away from the base, conductivity of the light absorbing layer is less than conductivity of molybdenum, the common power line is configured to provide a common voltage signal to a corresponding common electrode, and a surface of the base facing away from the common electrode is a display surface;
in a same common power line, an orthographic projection of the metal layer on the base is within an orthographic projection of the light absorbing layer on the base;
a material of the light absorbing layer is molybdenum oxide;
forming at least one thin film transistor on the base; wherein a gate of the at least one thin film transistor being arranged in a same layer as the common power line;
forming at least one conductive connecting line on a side of the metal layer away from the light absorbing layer, each of the at least one conductive connecting line being electrically connected to both a common electrode and a metal layer in a corresponding common power line, wherein
a part of the light absorbing layer covers the corresponding common electrode so as to no space exists between the common power line and the common electrode, and a part of each conductive connecting line covers both the corresponding common electrode and the corresponding metal layer;
a material of the at least one conductive connecting line is a transparent conductive material;
forming a pixel electrode at a side of each common electrode away from the base; wherein
the pixel electrode and the at least one conductive connecting line are made of a same material through a single patterning process, and the pixel electrode is insulated from the corresponding conductive connecting line.

* * * * *